United States Patent [19]

Yamaguchi et al.

[11] Patent Number: 4,599,580
[45] Date of Patent: Jul. 8, 1986

[54] CIRCUIT FOR COMPARING TWO OR MORE FREQUENCIES

[75] Inventors: Akira Yamaguchi, Yokohama; Hiroshi Shigehara, Tokyo; Hidemi Iseki, Yokohama, all of Japan

[73] Assignee: Kabushiki Kaisha Toshiba, Japan

[21] Appl. No.: 672,478

[22] Filed: Nov. 16, 1984

[30] Foreign Application Priority Data

Nov. 17, 1983 [JP] Japan ................. 58-216710
Nov. 17, 1983 [JP] Japan ................. 58-216712
Nov. 17, 1983 [JP] Japan ................. 58-216721
Nov. 17, 1983 [JP] Japan ................. 58-216722

[51] Int. Cl.⁴ ............................. H03L 7/08
[52] U.S. Cl. ............................. 331/8; 331/17; 331/25
[58] Field of Search ............. 331/1 A, 8, 14, 17, 331/25, 27, 34, 177 R; 328/133, 134; 307/525, 526, 527

[56] References Cited

U.S. PATENT DOCUMENTS

| | | | |
|---|---|---|---|
| 3,515,997 | 6/1970 | Babany ................. | 331/1 A |
| 3,701,039 | 10/1972 | Lang et al. ........... | 331/1 A |
| 3,783,394 | 1/1974 | Avery ..................... | 328/134 |
| 3,796,962 | 3/1974 | Hekimian ............. | 331/34 X |
| 3,851,277 | 11/1974 | Suzuki et al. ........ | 331/113 |

FOREIGN PATENT DOCUMENTS 7831407 6/1980 France .

OTHER PUBLICATIONS

IEEE Journal of Solid-State Circuits, vol. SC-17, No. 4, Aug. 1982, pp. 775-778.
Patent Abstracts of Japan, vol. 7, No. 23, (P-171) (1168) Jan. 29, 1983.
Linear IC Practical Circuit Manual, Radio Gijutsu Sha (Radio Gijutsu Co., Ltd.) by Y. Yokoi; pp. 345-348; Summary and System of f-V Converter, Practical Circuit of f-V Converter, Apr. 25, 1978.
Linear IC Practical Circuit Manual, Radio Gijutsu Sha (Radio Gijutsu Co., Ltd.) by Y. Yokoi; pp. 354-356; Principle and Application of PLL, Apr. 25, 1978.

Primary Examiner—Eugene R. LaRoche
Assistant Examiner—Robert J. Pascal
Attorney, Agent, or Firm—Finnegan, Henderson, Farabow, Garrett & Dunner

[57] ABSTRACT

According to a frequency comparing circuit of the present invention, there is provided a negative switched capacitor circuit having negative equivalent resistance, the value of which is determined according to the reference frequency and the frequency to be compared, and a positive switched capacitor circuit having positive equivalent resistance, the value of which is determined according to the reference frequency. A constant DC voltage is supplied in parallel to one terminal of the two switched capacitor circuits. The respective terminals of the switched capacitor circuits are commonly connected in order to produce the composite current of both output currents of the two switched capacitor circuits. The composite current is integrated by an integrator. Further, there is provided a Schmitt-type oscillating circuit. The oscillating frequency signal from the Schmitt-type oscillating circuit is supplied to the negative switched capacitor circuit. The higher level threshold voltage of the Schmitt-type oscillating circuit is determined according to the composite current of both output currents of the two switched capacitor circuits, thereby adjusting the frequency of the oscillating signal of the Schmitt-type oscillating circuit. The oscillating signal is supplied to the positive switched capacitor circuit. The lower level threshold voltage of the Schmitt-type oscillating circuit is determined according to the composite current of both output currents of the two switched capacitor circuits. Therefore, the frequency of the oscillating signal of the Schmitt-type oscillating circuit is adjusted.

21 Claims, 27 Drawing Figures

F I G. 9
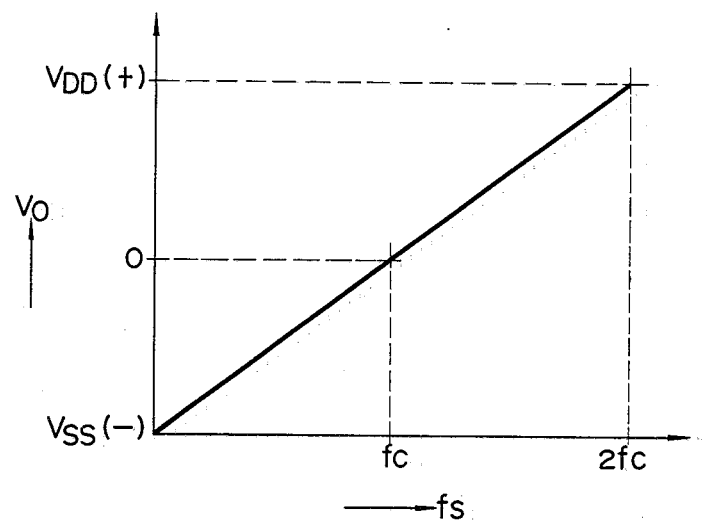
F I G. 10
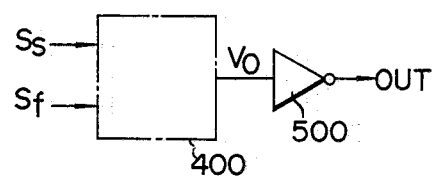

F I G. 14
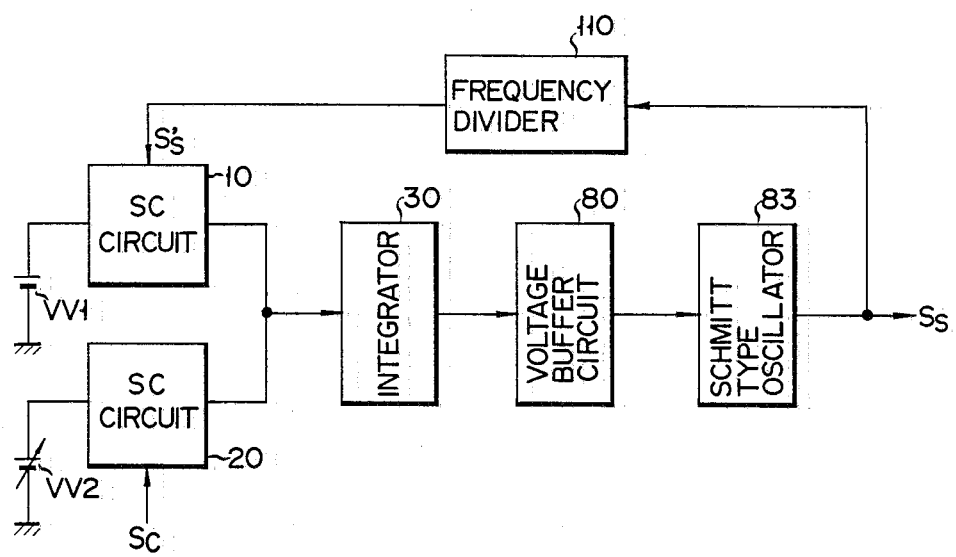
F I G. 15
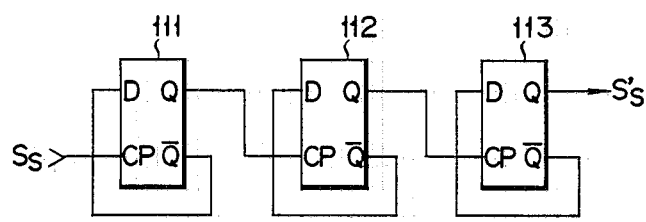

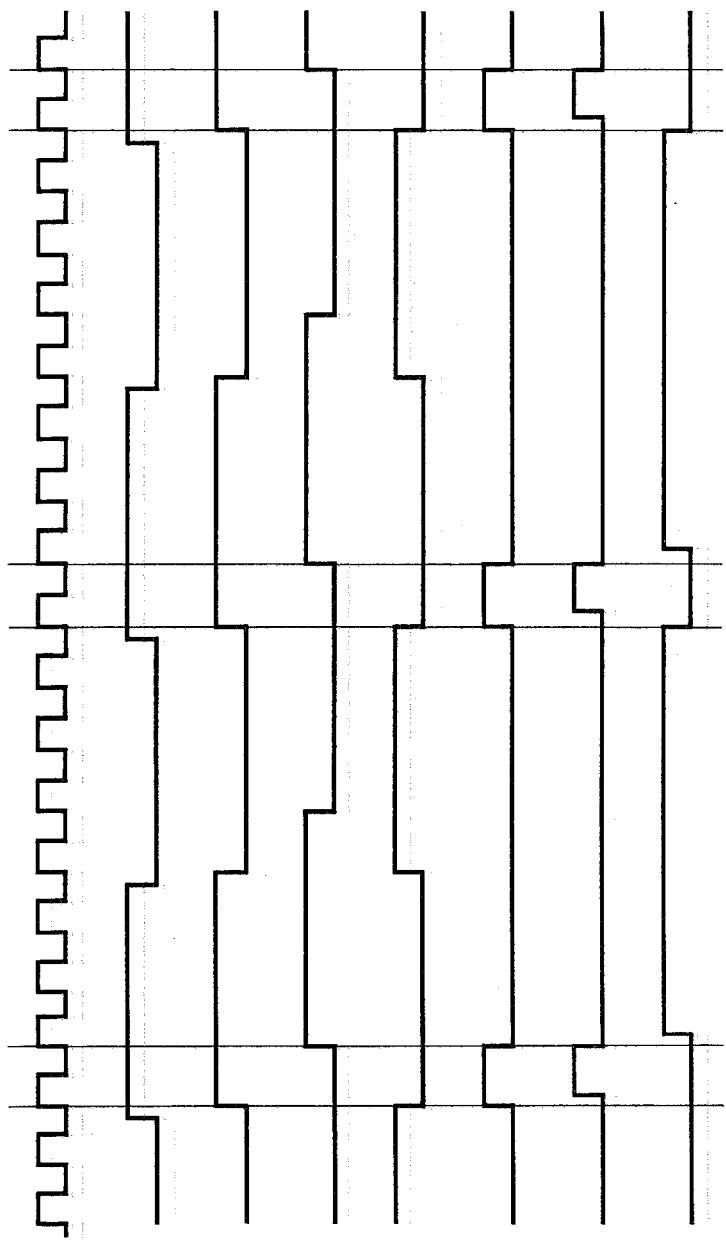

CIRCUIT FOR COMPARING TWO OR MORE FREQUENCIES

BACKGROUND OF THE INVENTION

The present invention relates to a frequency comparing circuit which compares two frequency signals.

Recently, devices which perform speech synthesis using digital technology have been developed and used. In such a device, an impulse and a white noise are used as a sound source. The signal from the sound source is passed through several digital filters to obtain an audio signal. The conditions for the digital filters depend on the audio signal to be achieved. Furthermore, the conditions for the digital filters in the digital speech synthesizer are set by analyzing and recognizing an actual voice.

FIG. 1 is a conventional block diagram of a speech recognition circuit. In the figure, a mike amplifier 1 amplifies an analog signal from a microphone (not shown). The output from the mike amplifier 1 is supplied in parallel to, for example, four band-pass filters (BPF) 2A, 2B, 2C and 2D. The signals which pass through the four band-pass filters 2A, 2B, 2C and 2D are detected by four detectors, respectively. The detected four signals are supplied to four low-pass filter circuits 4A, 4B, 4C and 4D, respectively. The signals which pass through the low pass filter circuits 4A, 4B, 4C and 4D are selectively supplied to an analog/digital converter (A/D) 6 through a multiplexer 5. The digital output from the analog/digital converter 6 results in a recognition result for the voice input through the microphone.

The employment of switched-capacitor filter technology introduces higher integration and higher accuracy to the recent speech recognition circuit. In other words, the mike amplifier 1, band-pass filter circuits 2A through 2D and low-pass filter circuits 4A through 4D all adopt the switched capacitor circuit. For the control of the switched capacitor circuit, any circuit which uses such a switched capacitor circuit is required to include an oscillator and a clock generator which produces various clock pulses from the oscillator output.

When an accurate oscillating frequency is required, the actual oscillating frequency can be matched to the accurate oscillating frequency by knowing whether the actual oscillating frequency is greater or smaller than the accurate oscillating frequency, or the fluctuation or ratio between the actual oscillating frequency and the accurate oscillating frequency.

A PLL (phase locked loop) circuit has been known as a means for accurately detecting which frequency is greater or smaller, or the fluctuation or ratio between the actual and accurate frequencies.

However, the PLL circuit is not adapted to integration due to its complicated construction. Therefore, with prior art circuits with simplified constructions, an accurate oscillating frequency can not be obtained, thereby degrading the switched capacitor circuit which leads to a speech recognition circuit with poor accuracy.

SUMMARY OF THE INVENTION

It is an object of the present invention to provide a frequency comparing circuit with simplified circuit construction, which can detect with high accuracy the cycle relationship between two frequency signals.

Another object of the invention is to provide a simply constructed frequency comparing circuit which can detect with high accuracy a fluctuation between two frequency signals.

A further object of the invention is to provide a frequency-voltage converting circuit which can stably generate with high accuracy an arbitrary multiple of frequencies from the reference signal derived from an oscillating signal: the oscillating signal comes from an oscillator such as a crystal oscillator which stably oscillates.

To achieve the above object, according to the present invention, there is provided a frequency comparing circuit comprising:

a first means having negative equivalent resistance, the value of which being determined according to the frequency of a first signal;

a second means having positive equivalent resistance, the value of which being determined according to the frequency of a second signal;

third means for supplying DC bias to said first and second means; and fourth means for integrating a composite output current of said first and second means.

BRIEF DESCRIPTION OF THE DRAWINGS

Other objects and features of the present invention will be apparent from the following description taken in connection with the accompanying drawings in which:

FIGS. 6A and 6B are timing charts of the switched capacitor circuit shown in FIGS. 4 or 5;

FIG. 9 is a characteristic of the embodiment shown in FIG. 8;

FIG. 10 is a circuit diagram for application of the invention;

FIG. 14 is a block diagram showing another embodiment of the oscillator of the invention;

FIG. 15 is a detailed circuit diagram of an embodiment of a frequency divider shown in FIG. 14;

FIGS. 18A through 18H are timing charts of the circuitry in FIG. 17 in which: FIG. 18A shows the output signal of the Schmitt trigger; FIG. 18B, the output signal of the frequency divider 110; FIG. 18C, the output signal of the F/F 121 in FIG. 17; FIG. 18D, the output signal of F/F 122 in FIG. 17; FIG. 18E, the inverted output signal of F/F 121 in FIG. 17; FIG. 18F, the output signal of NOR gate 124 in FIG. 17; FIG. 18G, the inverted output signal of NAND gate 127 in FIG. 17; and FIG. 18H, the output of NOR gate 128 in FIG. 17.

DETAILED DESCRIPTION OF THE PREFERRED EMBODIMENTS

Figure 1:
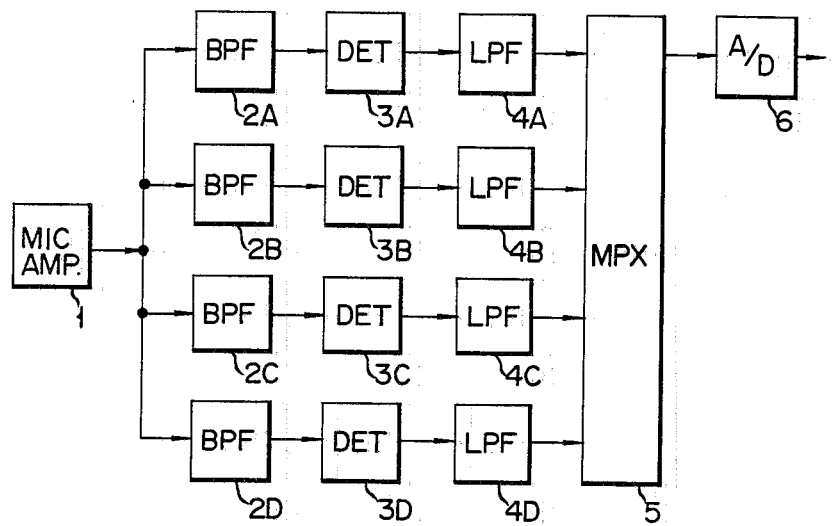
FIG. 1 is a block diagram showing a conventional construction of a speech recognition circuit.
Figure 2:
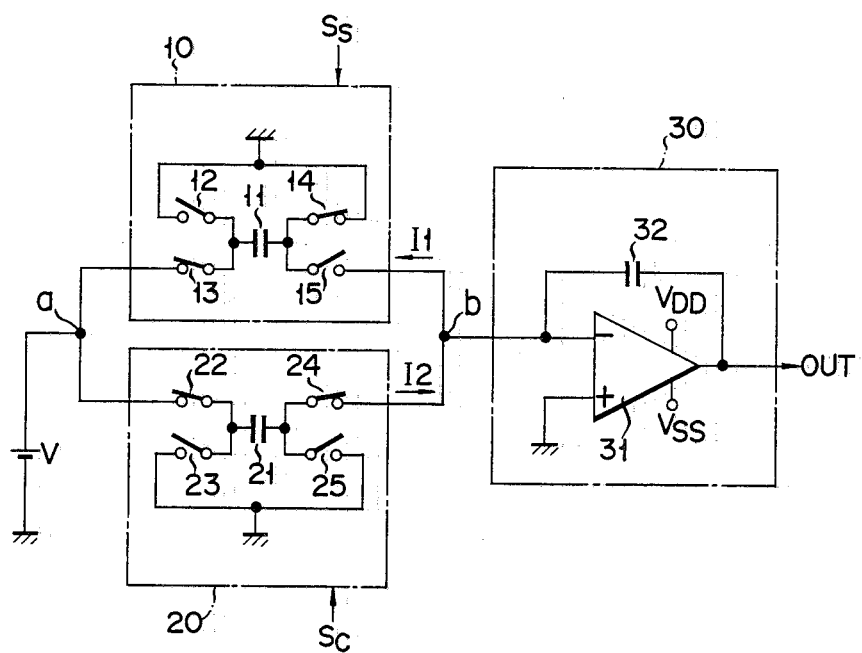
FIG. 2 is a circuit diagram showing an embodiment of a frequency comparing circuit of the present invention.

FIG. 2 is a circuit diagram showing an embodiment of a frequency comparing circuit of the present invention. The switched capacitor circuit 10 comprises a capacitor 11 and four switches 12 through 15. The circuit 10 has a negative equivalent resistance, and its value is determined corresponding to the frequency $f_s$ of an oscillating signal $S_s$ from an oscillator. One terminal of each switch 12 and 13 is connected to one terminal of the capacitor 11, and the other terminal of the switch 12 is grounded. The other terminal of the capacitor 11 is connected to one terminals of the switches 14 and 15, and the other terminal of the switch 14 is grounded.

Among the four switches 12 through 15, a pair of switches 12 and 15 and a pair of switches 13 and 14 are alternatively turned on in response to the Signal $S_s$. The switched capacitor circuit 20 comprises a capacitor 21 and four switches 22 through 25 and has a positive equivalent resistance, the value of which is determined corresponding to a reference signal $S_c$ with frequency $f_c$. One terminal of the capacitor 21 is connected to one terminal of each switch 22 and 23, and the other terminal of the switch 23 is grounded. The other terminal of the capacitor 21 is connected to one termianl of each switch 24 and 25, and the other terminal of the switch 25 is grounded. A switch pair 22 and 24 and another switch pair 23 and 25 are alternatively turned on in response to a signal $S_c$.

The other terminal of the switch 13 in the switched capacitor circuit 10 and the other terminal of the switch 22 in the switched capacitor circuit 20 are connected at a common connection a. Futhermore, the positive electrode of a DC power source V is connected to the common connection a. The negative electrode of the DC power source V is grounded. Also, the other terminals of the switch 15 in the switched capacitor circuit 10 and the switch 24 in the switched capacitor circuit 20 are connected to a common connection b. Furthermore, an input terminal of an integrator 30 is connected to the common connection b. The integrator 30 is provided with a differential amplifier 31 having an inverted input terminal, a non-inverted input terminal and output terminal, and a capacitor 32. The capacitor 32 is connected between the inverted input terminal and output terminal, and the non-inverted input terminal of the differential amplifier 31 is grounded. The differential amplifier 31 operates at a voltage between a positive electrode voltage $V_{DD}$ and a negative electrode voltage $V_{SS}$. The ground voltage is set at an intermediate potential between the positive and negative voltage, for example, at 0 V. The inverted input terminal of the differential amlifier 31 serves as the input terminal of the integrator 30. The integrator 30 produces on its output terminal a signal OUT corresponding to the magnitude relation between two frequencies $f_s$ and $f_c$.

The equivalent resistance $R_1$ of the switched capacitor circuit 10 (hereafter referred to as SC circuit) is given by:

$$R_1 = -\frac{1}{C_1 \cdot f_s} \qquad (1)$$

wherein $C_1$ represents the capacitance of the capacitor 11. As well, the equivalent resistance $R_2$ of the SC circuit 20 is given by:

$$R_2 = \frac{1}{C_2 \cdot f_c} \qquad (2)$$

wherein $C_2$ represents the capacitance of the capacitor 21.

As the one terminal of each two SC circuits 10 and 20, namely, the other terminals of the switches 13 and 22 are connected through the connection a to the positive electrode of the DC power source V, the positive bias from the DC power source V is supplied to both SC circuits 10 and 20. Therefore, a predetermined DC current flows into the respective SC circuits 10 and 20. As the SC circuit 10 has negative equivalent resistance $R_1$, the direction of the current $I_1$ is to the left in FIG. 2. Also, the SC circuit 20 has a positive equivalent resistance $R_2$, and the direction of the current $I_2$ is to the right in FIG. 2. In other words, the directions of the currents $I_1$ and $I_2$ are opposite to each other. A composite current of $I_1$ and $I_2$ is supplied to the integrator 30. When the composite current is 0, the output signal OUT of the integrator 30 becomes ground voltage. When $I_1 > I_2$ and current corresponding to the difference between $I_1$ and $I_2$ flows from the integrator 30, the level of the output signal OUT of the integrator 30 becomes high ($V_{DD}$ level). On the contrary, when $I_2 > I_1$ and current corresponding to the difference between $I_1$ and $I_2$ flows into the integrator 30, the level of the output signal OUT of the integrator 30 become low ($V_{SS}$ level). Suppose that the capacitance $C_1$ of the capacitor 11 in the SC circuit 10 and the capacitance $C_2$ of the capacitor 21 in the SC circuit 20 are equally set. When the frequency $f_s$ of the oscillating signal $S_s$ coincides with the frequency $f_c$ of the reference signal $S_c$, the output signal OUT of the integrator 30 becomes ground voltage. Furthermore, when the frequency $f_s$ is greater than the frequency $f_c$, the level of the output signal OUT of the integrator 30 becomes high. On the other hand, when the frequency $f_c$ is smaller than the frequency $f_c$, the level of the output signal OUT of the integrator 30 becomes low. In summary, the output signal OUT of the integrator 30 varies its level according to the cyclical relationship of the two frequencies $f_s$ and $f_c$. Therefore, the comparison of the two frequencies can be performed by determining the output signal OUT. The equivalent resistances $R_1$ and $R_2$ of the SC circuits 10 and 20 are determined only by the frequencies $f_s$ and $f_c$, provided that the capacitances $C_1$ and $C_2$ are constant as shown in the equations (1) and (2). Since the capacitances $C_1$ and $C_2$ can be set with a relatively higher accuracy than the resistances, the respective frequencies $f_s$ and $f_c$ can be converted into the resistances $R_1$ and $R_2$ with high accuracy. Furthermore, the integrator 30 achieves the signal OUT by integrating the composite values of flowing currents corresponding to the resistances $R_1$ and $R_2$. Thus, the comparison between $f_s$ and $f_c$ can be performed with high accuracy even if the slew rate or gain of the differential amplifier 31 fluctuates.

As described above, according to the present invention, the comparison and detection can be performed with high accuracy on the cyclical relationship between the frequency $f_s$ of the oscillating signal $S_s$ from the oscillator and the frequency $f_c$ of the reference signal $S_c$. Therefore, the frequency $f_s$ can be matched with the reference frequency $f_c$ with high accuracy by using the output signal OUT.

Also in this embodiment, the apparent frequency of the reference signal $S_c$ can be varied from the actual value $f_c$ by changing the capacitances $C_1$ and $C_2$ of the capacitors 11 and 21 in the SC circuits 10 and 20. For example, by setting the values of the capacitors 11 and 21 to satisfy $C_1 = 2C_2$, the comparison and detection of the cyclical relationship between $2f_c$ and $f_s$ can be performed.

Figure 3:
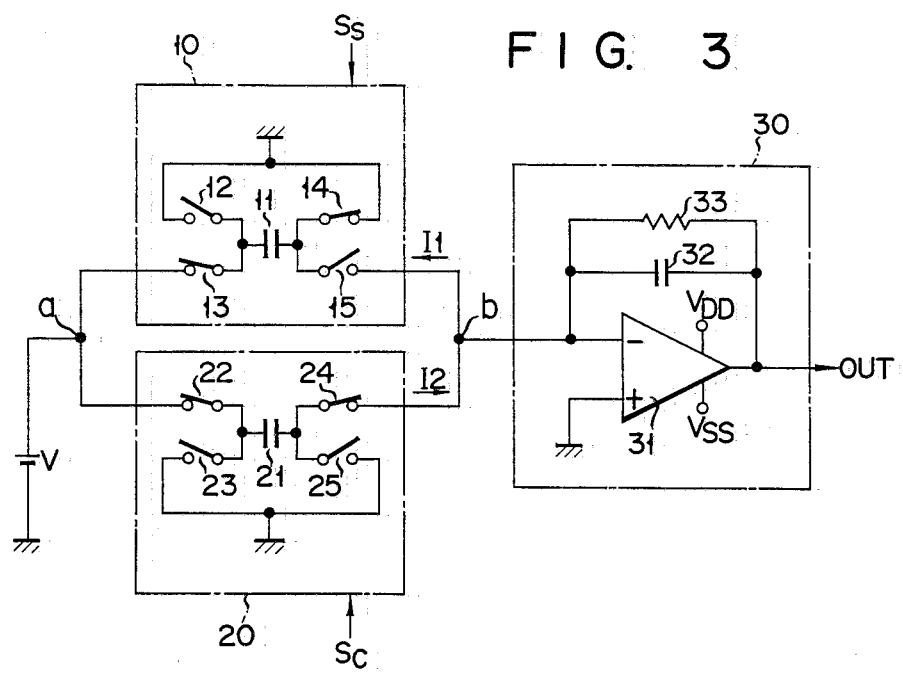
FIG. 3 is a circuit diagram showing another embodiment of the present invention.

FIG. 3 is a circuit diagram showing a construction of another embodiment of the frequency comparing circuit of the invention. The circuit in FIG. 3 is same as that in FIG. 2 except that a resistor 33 is connected in parallel to the capacitor 32 in the integrator 30.

In this embodiment, as in the embodiment of FIG. 3, when the composite value of the output currents $I_1$ and $I_2$ in the SC circuits 10 and 20 is 0, the output signal OUT is set to ground voltage. However, when the composite value is not 0, the output signal OUT is set to less than the $V_{DD}$ or $V_{SS}$ level in accordance with the electrode of the composite current.

Figure 4:
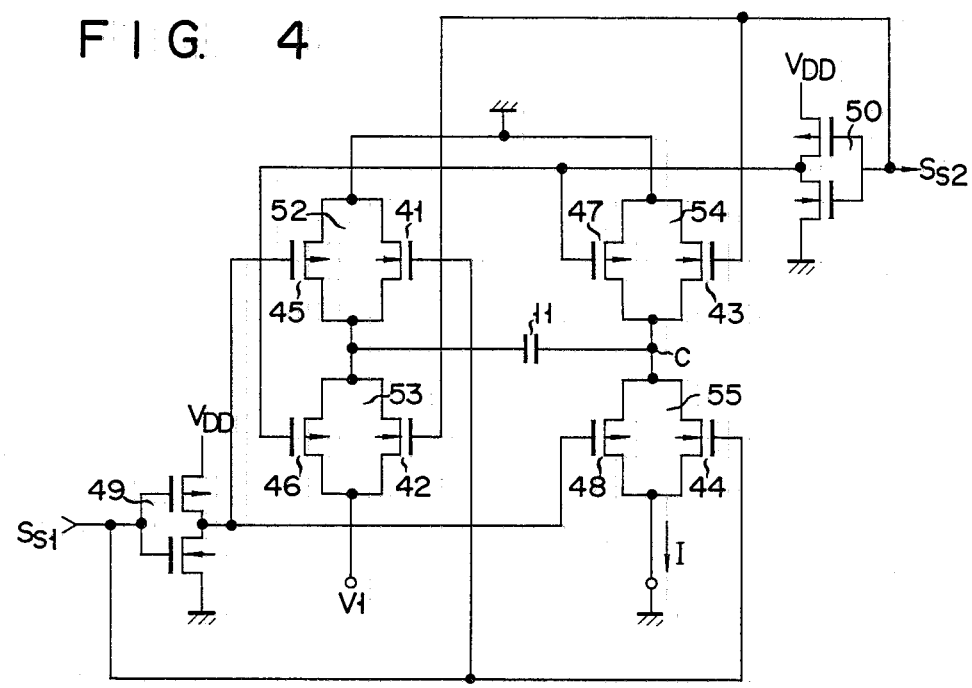
FIG. 4 is a detailed circuit diagram of a switched capacitor circuit 10 used in the embodiment of FIGS. 2 and 3.
Figure 5:
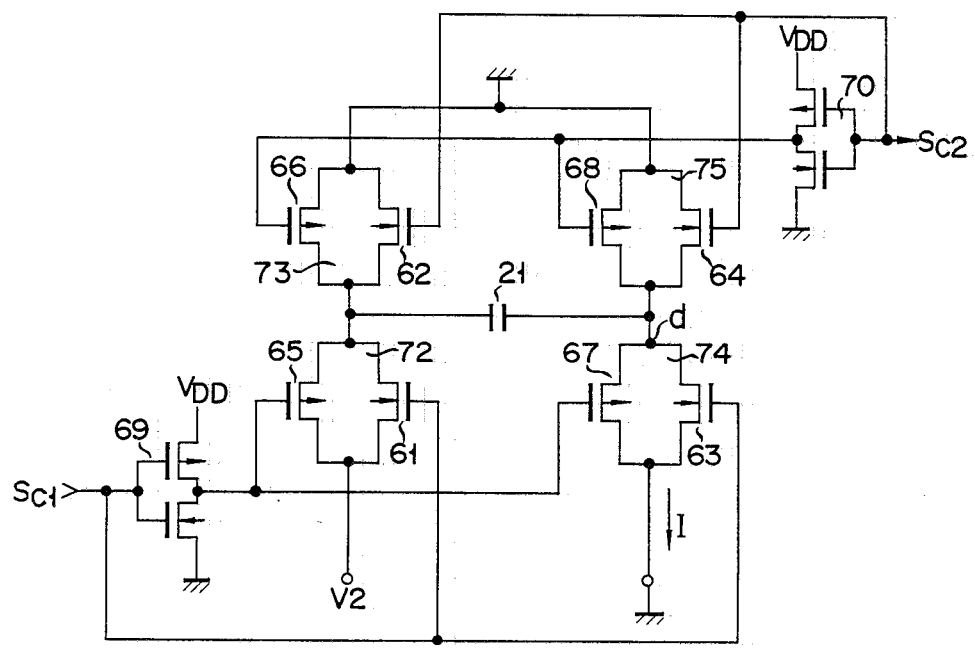
FIG. 5 is a detailed circuit diagram of a switched capacitor circuit 20 used in the embodiment of FIGS. 2 and 3.

FIGS. 4 and 5 show detailed circuits of the SC circuits 10 and 20 used in the above embodiment, respectively. The same numerals as in FIGS. 2 and 3 are used for the same parts in FIGS. 4 and 5. Furthermore, two signals $S_{s1}$ and $S_{s2}$ or $S_{c1}$ and $S_{c2}$ are used whose phases are different than each other as shown in the timing charts of FIGS. 6A and 6B.

The switches 12 through 15 in the SC circuit 10 having negative resistance comprise, as shown in FIG. 4, CMOS switches 52 through 55 in which N channel MOSFETs 41 through 44 and P channel MOSFETs 45 through 48 are connected in parallel to each other. The signal $S_{s1}$ in FIG. 6A is supplied to the gates of the N channel MOSFETs 41 and 44 and through a CMOS inverter 49 to the gates of the P channel MOSFETs 45 and 48. The signal $S_{s2}$ in FIG. 6B is supplied to the gates of the N channel MOSFETs 42 and 43 and through a CMOS inverter 50 to the gates of the P channel MOSFETs 46 and 47.

Now the switching control of the CMOS switches 52 through 55 will be described in response to the signals $S_{s1}$ and $S_{s2}$ under the condition that the DC voltage $V_1$ is supplied to the other terminal of the CMOS switch 53 and the other terminal of the CMOS switch 55 is grounded. When the level of the signal $S_{s2}$ is high, the CMOS switches 53 and 54 turn on. Then, the other terminal (point C in FIG. 4) of the capacitor 11 will be charged at $-C \cdot V_1$. When the level of the signal $S_{s1}$ is high, the CMOS switches 52 and 55 turn on. At this time, the positive charge $+C_1 \cdot V_1$ from the ground is supplied through the CMOS switch 55 to the point C so as to cancel the negative charge at the point C. When such an operation is repeated $f_c$ times per second and the direction of the current flowing through the CMOS switch 55 from the point C is positive, the value of the current I which flows in the SC circuit is given by:

$$-I = C_1 \cdot V_1 f_s \quad (3)$$

The equivalent resistance R in the SC circuit 10 is obtained by dividing the current I by the supply voltage $V_1$. Thus, the equivalent resistance R is given by:

$$R = \frac{V_1}{-C_1 \cdot V_1 \cdot f_s} = -\frac{1}{C_1 \cdot f_s} \quad (4)$$

The right side in the equation (4) is the same as the right side in equation (1). Therefore, the equation (4) reveals that the SC circuit 10 in FIG. 4 has the negative equivalent resistance corresponding to the frequency $f_s$.

The switches 22 through 25 in the SC circuit 20 comprise the CMOS switches 72 through 75 in which N channel MOSFETs 61 through 64 and P channel MOSFETs 65 through 68 are connected in parallel, respectively, as shown in FIG. 5. The signal $S_{c1}$ in FIG. 6A is supplied to the gates of the N channel MOSFETs 61 and 63 and through the CMOS inverter 69 to the gates of the P channel MOSFETs 65 and 67. The signal $S_{c2}$ in FIG. 6B is supplied to the gates of the N channel MOSFETs 62 and 64 and through a CMOS inverter 70 to the P channel MOSFETs 66 and 68.

Now a switching control will be described of the CMOS switches 72 through 75 in response to the signals $S_{c1}$ and $S_{c2}$ under the condition that the DC voltage $V_2$ is supplied to the other terminal of the CMOS switch 72 and the ground voltage is supplied to the other terminal of the CMOS switch 74. When the level of the signal $S_{c1}$ is high, the CMOS switches 72 and 74 turn on. At this time, the capacitor 21 is charged to $C_2 \cdot V_2$. Then, when the level of the signal $S_{c2}$ becomes high, the CMOS switches 73 and 75 turn on. Therefore, the charge stored in the capacitor 21 is discharged. When such an operation is repeated $f_c$ times per second, and the direction of the current flowing from the other terminal of the capacitor 21 (point d in FIG. 5) through the CMOS switch 74 to the ground is positive, the current I which flows in the SC circuit 20 is given by:

$$I = C_2 \cdot V_2 \cdot f_c \quad (5)$$

The equivalent resistance R in the SC circuit is obtained by dividing the supply voltage $V_2$ by the current I. That is:

$$R = \frac{V_2}{C_2 \cdot V_2 \cdot f_c} = \frac{1}{C_2 \cdot f_c} \quad (6)$$

The right side in equation (6) is the same as that in equation (2). Thus, the equation (6) reveals that the SC circuit 20 in FIG. 5 has a positive equivalent resistance corresponding to the frequency $f_c$.

Figure 7:
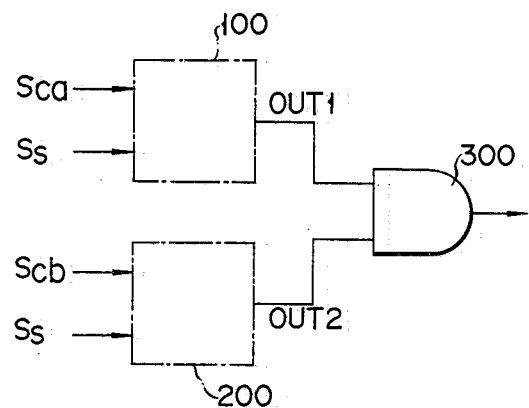
FIG. 7 is a circuit diagram for application of the invention.

FIG. 7 is a circuit diagram showing an applied construction of the invention. The circuit of this application comprises two frequency comparing circuits 100 and 200 constructed like those in FIG. 2 and an AND gate 300 which receives both the output signals OUT1 and OUT2. The SC circuit having the negative equivalent resistance (referred to by 10 in FIG. 2) in one frequency comparing circuit 100 is controlled by a signal $S_{ca}$ having a higher reference frequency $f_{ca}$. The SC circuit having a positive equivalent resistance (referred to by 20 in FIG. 2) is controlled by a signal $S_s$ having a frequency $f_s$ to be compared. The SC circuit having a negative equivalent resistance (referred by 10 in FIG. 2) in the frequency comparing circuit 200 is controlled by a signal $S_{cb}$ having a lower frequency $f_c$ and the SC circuit having a positive equivalent resistance is controlled by the signal $S_s$.

In this circuit, it is assumed that all the capacitances in the SC circuit are equally set. The level of the output signals OUT1 and OUT2 of the frequency comparing circuits 100 and 200 becomes high, thus the output level of the AND gate 300 becomes high only when the relation $f_{ca} > f_s > f_{cb}$ is satisfied between the frequencies $f_{ca}$, $f_{cb}$ and $f_s$ of the signals $S_{ca}$, $S_{cb}$ and $S_s$, respectively. In other words, the circuit can detect whether the frequency $f_s$ to be compared is between the higher reference frequency $f_{ca}$ and the lower reference frequency signal $f_{cb}$.

The present invention is not limited to the above embodiments but various modification can be performed. In the embodiments in FIGS. 2 and 3, a common DC power source V is used to flow DC current in the SC circuits 10 and 20. However, different DC power sources may be used for the SC circuits 10 and 20. When using different DC power sources, the apparent frequency of the reference signals $S_c$ can be varied from the actual frequency $f_c$ by using different DC power sources as changing values of the capacitors 11 and 21. In the above embodiments, one SC circuit 10 having a negative equivalent resistance is controlled by the signal $S_s$, and the other SC circuit 20 having a positive equivalent resistance is controlled by the signal $S_c$. However, the signals $S_s$ and $S_c$ are interchangeable.

Figure 8:
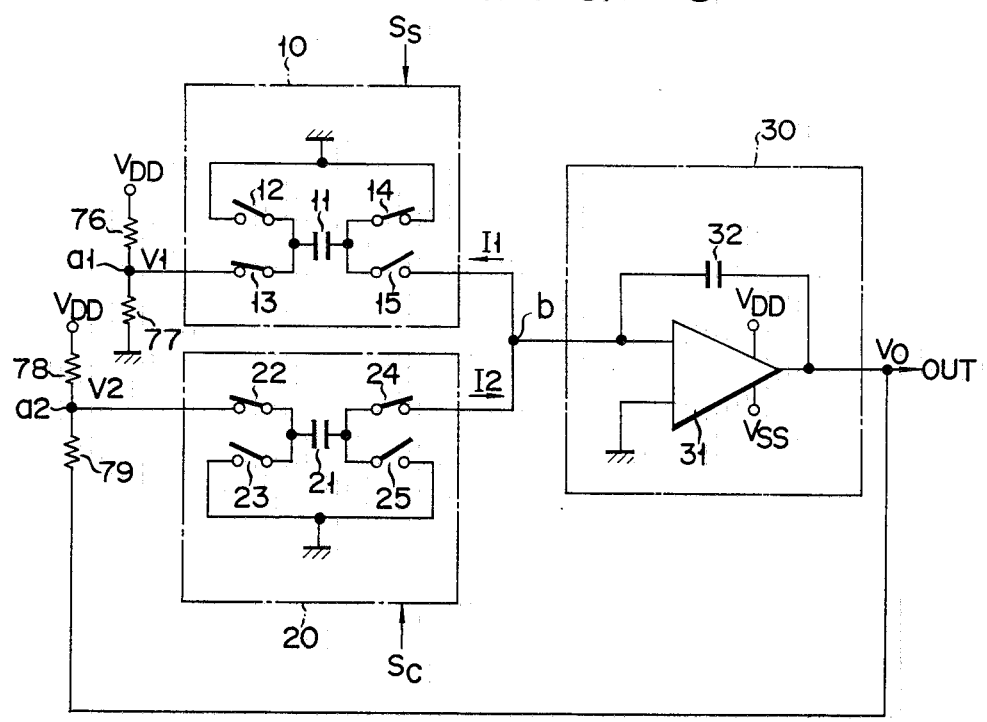
FIG. 8 is a circuit diagram showing another embodiment of a frequency comparing circuit of the invention.

FIG. 8 shows an embodiment of the frequency comparing circuit which can perform fluctuations between the two signal's frequencies with high accuracy. The same numerals are used for the same parts in FIG. 2 and the descriptions are omitted. In this embodiment, two resistors 76 and 77 are connected in series between the positive electrode power source $V_{DD}$ and the ground. The other terminal of the switch 13 in the switched capacitor circuit 10 is connected to a serial connection a1 between the resistors 76 and 77. Furthermore, two resistors 78 and 79 are serially connected between $V_{DD}$ and the output point OUT of voltage $V_0$. The other terminal of the switch 22 of the SC circuit 20 is connected at the serial connection a2 between the resistors 78 and 79. The differential amplifier 31 operates at a voltage between the positive electrode power source voltage $V_{DD}$ and negative electrode power source voltage $V_{SS}$ whose absolute value is equal that of $V_{DD}$. The ground potential is set between $V_{DD}$ and $V_{SS}$, for example, to 0 V. In the integrator 30, the inverted input terminal of the differential amplifier 31 serves as the input terminal, and from the output terminal, voltage proportional to the fluctuation between the two frequencies $f_s$ and $f_c$ is provided.

In such a construction, a constant positive voltage $V_1$, determined by the resistance ratio of the resistors 76 and 77, and the voltage $V_{DD}$ is supplied to the connection a1 where the one terminal of the SC circuit 10, that is, the other terminal of the switch 13, is connected. The equivalent resistance $R_1$ of the SC circuit 10 becomes negative as in the equation (1) if the value of the capacitor 11 is $C_1$. Thus, the direction of the current $I_1$ flowing into the SC circuit 10 is to the left in FIG. 8. Positive or negative voltage $V_2$, determined by the resistance ratio of the resistors 78 and 79, voltage $V_{DD}$, and the output voltage $V_0$ from the integrator 30, is supplied to the connection a2 where one terminal of the SC circuit 20, that is, the other terminal of the switch 22, is connected. The equivalent resistance $R_2$ of the SC circuit 20 becomes positive as in the equation (2) if the value of the capacitor 21 is $C_2$.

When the voltage $V_2$ is positive, the direction of the current I2 flowing into the SC circuit 20 is to the right in FIG. 8. The integrator 30 integrates the composite current of $I_1$ and $I_2$ and reduces voltage $V_0$.

Now supposed that the capacitance $C_1$ of the capacitor 11 in the SC circuit 10 is equal to the capacitance $C_2$ of the capacitor 21 in the SC circuit 20, all the resistors 76, 77, 78 and 79 have the same resistance, and the voltages V1 and V2 are equal. Under this condition, when the frequency $f_s$ of the oscillating signal $S_s$ coincides with the frequency $f_c$ of the reference signal $S_{c1}$, current $I_1$ is equal to current I2, and their directions are opposite to each other as shown in FIG. 8. Therefore, the composite current of $I_1$ and $I_2$ becomes 0, and the output voltage of the integrator 30 becomes ground voltage. When the output voltage $V_0$ is ground voltage, the voltage $V_2$ at the connection a2 becomes $(V_{DD}-0)/2$ as the values of the resistors 78 and 79 are equal. Also, the voltage $V_1$ at the connection a1 becomes $(V_{DD}-0)/2$ as the values of the resistors 76 and 77 are equal. Therefore, voltage $V_1$ is equal to voltage $V_2$. Thus, the output voltage $V_0$ of the integrator 30 becomes ground voltage (0 V) when the frequency $f_s$ coincides with the frequency $f_c$. When the output voltage $V_0$ is equal to the ground voltage, the voltage $V_2$ at the connection a2 becomes $(V_{DD}-0)/2$ as the values of the resistors 78 and 79 are equal. Also, the voltage $V_1$ at the connection a1 becomes $(V_{DD}-0)/2$ as the values of the resistors 76 and 77 are equal. Therefore, voltage $V_1$ is equal to voltage $V_2$. Thus, the output voltage $V_0$ of the integrator 30 is fixed at the ground level when the frequency $f_s$ coincides with the frequency $f_c$. On the other hand, when the frequency $f_s$ is lower than the frequency $f_c$, the equivalent resistance of the SC circuit 10 given by the equation (1) becomes greater. Since the value of voltage $V_1$ supplied to the SC circuit 10 is constant, the greater the resistance $R_1$, the smaller the current value $I_1$. As a result, the composite current of $I_1$ and I2 becomes positive (in the direction of flowing into the integrator 30). The integrator 30 integrates the composite current and produces negative voltage $V_0$ proportional to the current. The voltage $V_0$ serves to lower the voltage $V_2$ at the connection a2, so that the value of the current flowing in the SC circuit 20 becomes smaller. When the currents $I_1$ and I2 are balanced, the output voltage $V_0$ of the integrator 30 becomes constant.

Now when the frequency $f_s$ rises from the balance and becomes higher than the frequency $f_c$, the equivalent resistance $R_1$ of the SC circuit 10 becomes smaller. Thus, the value of the current $I_1$ flowing in the SC circuit 10 becomes greater. As a result, the composite current of $I_1$ and I2 become negative (in the direction of flowing out of the integrator 30). At this time, the integrator 30 integrates the composite current and produces a positive voltage $V_0$ proportional to the current value. Thus produced voltage $V_0$ serves to raise the voltage $V_2$ at the connection a2. Therefore, the value of current I2 flowing in the SC circuit 20 becomes greater. When the balance between the currents $I_1$ and I2 is obtained, the output $V_0$ of the intergrator 30 becomes constant.

FIG. 9 shows a characteristic of the embodiment in FIG. 8 when $C_1 = C_2$. In the figure, the frequency $f_s$ of the oscillating signal $S_s$ is measured on the abscissa, and the output voltage $V_0$ of the integrator 30 is measured on the ordinate. As is shown, there is a proportional relation between the frequency $f_s$ and the output voltage $V_0$. Therefore, from the output voltage $V_0$, the fluctuation between two frequencies $f_s$ and $f_c$ can be measured. That is, when the output voltage $V_0$ is 0, there is no fluctuation between the frequencies. When the voltage $V_0$ is positive, the frequency $f_s$ fluctuates corresponding to a voltage higher than the frequency $f_c$, and when the voltage $V_0$ is negative, the frequency $f_s$ fluctuates corresonding to a voltage lower than the frequency $f_c$. Furthermore, the equivalent resistances $R_1$ and $R_2$ in the SC circuits 10 and 20 depend, as is shown in the equations (1) and (2), only on the frequencies $f_s$ and $f_c$ if the values of $C_1$ and $C_2$ are constant, respectively. Therefore, the values of the capacitors $C_1$ and $C_2$ can be set with relatively higher accuracy compared to those of the resistors. Thus, the frequencies $f_s$ and $f_c$ can be converted into equivalent resistances $R_1$ and $R_2$ with higher accuracy.

Also, in this embodiment, the apparent frequency of the reference signal $S_c$ can be varied from the actual frequency $f_c$ by setting the values $C_1$ and $C_2$ of the capacitors 11 and 21 and values of resistors 76 and 79. For example, by setting the values of the capacitors 11 and 21 to satisfy $C_1 = 2C_2$, the gradient of the characteristic line in FIG. 9 will be doubled. In this case, $V_0$ becomes 0 at the point of $fs = f_c/2$. Therefore, the output voltage $V_0$ corresponding to the fluctuation between the half-divided frequency of the frequency $f_c$ and frequency $f_s$ can be obtained. If the value of resistor 76 is set to be equal to that of resistor 77 and the value of resistor 78 is set to be greater than that of resistor 79, there is a relation of $V_1 > V_2$ at $V_0 = 0$. If the value of resistor 78 is set three times that of resistor 79, the relations are $V_1 = V_{DD}/2$ and $V_2 = (V_{DD} - V_0)/4$. Therefore, the gradient of the characteristic line in FIG. 9 will be doubled so that the same effect can be obtained as $C_1 = 2C_2$.

Using the circuit, the applicant has conducted an experiment where 100PF is selected for $C_1$ and $C_2$, $+7$ V for $V_{DD}$, $-7$ V for $V_{SS}$ and 2 KHz, 4 KHz and 8 KHz for $f_c$, respectively. As a result of the experiment, the output voltage $V_0$ represents linear characteristic when the frequency $f_s$ is in the range of 0.1 fc through 1.7 or 1.8 fc.

FIG. 10 is a circuit diagram showing an applied construction of the invention. The application circuit is constructed in such a way that the output voltage $V_0$ of a frequency comparing circuit 400, constructed as in FIG. 8, is supplied to an inverter 500, thereby to obtain a logic signal OUT with either a high or low level set according to the voltage $V_0$.

Figure 11A:
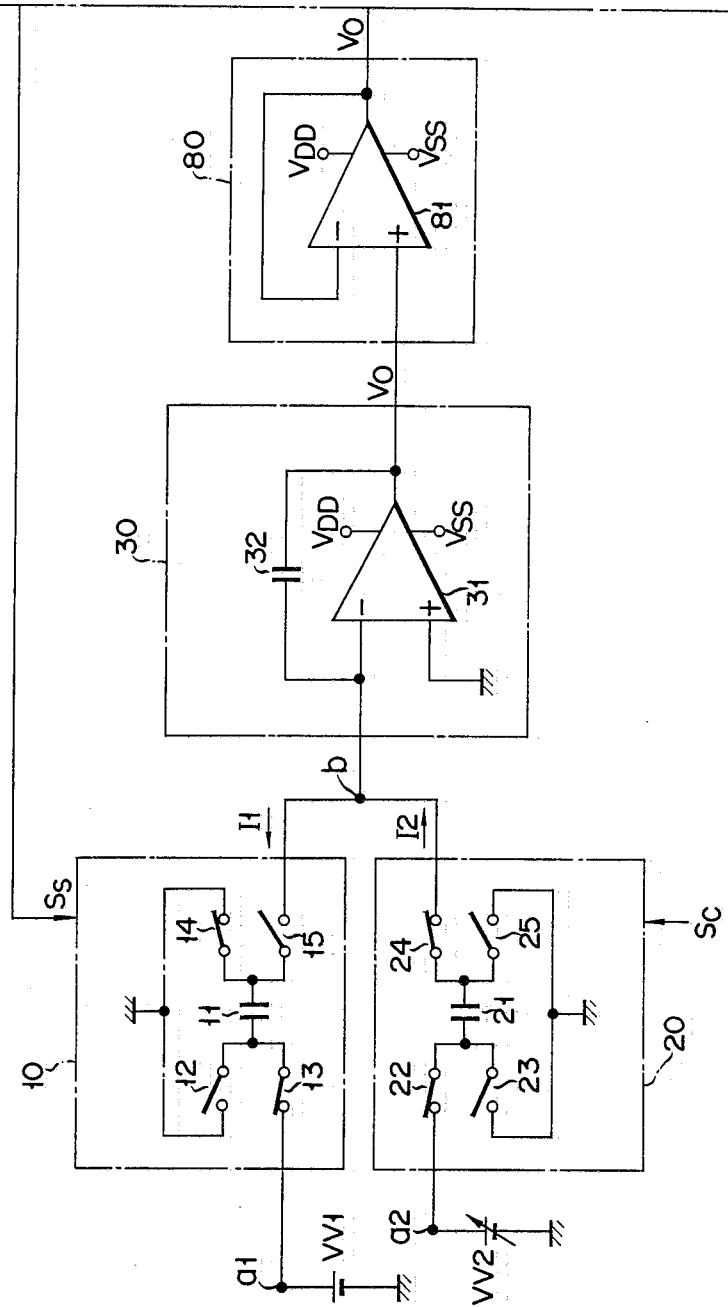
FIGS. 11A and 11B are circuit diagrams showing an embodiment of an oscillator of the invention.
Figure 11B:
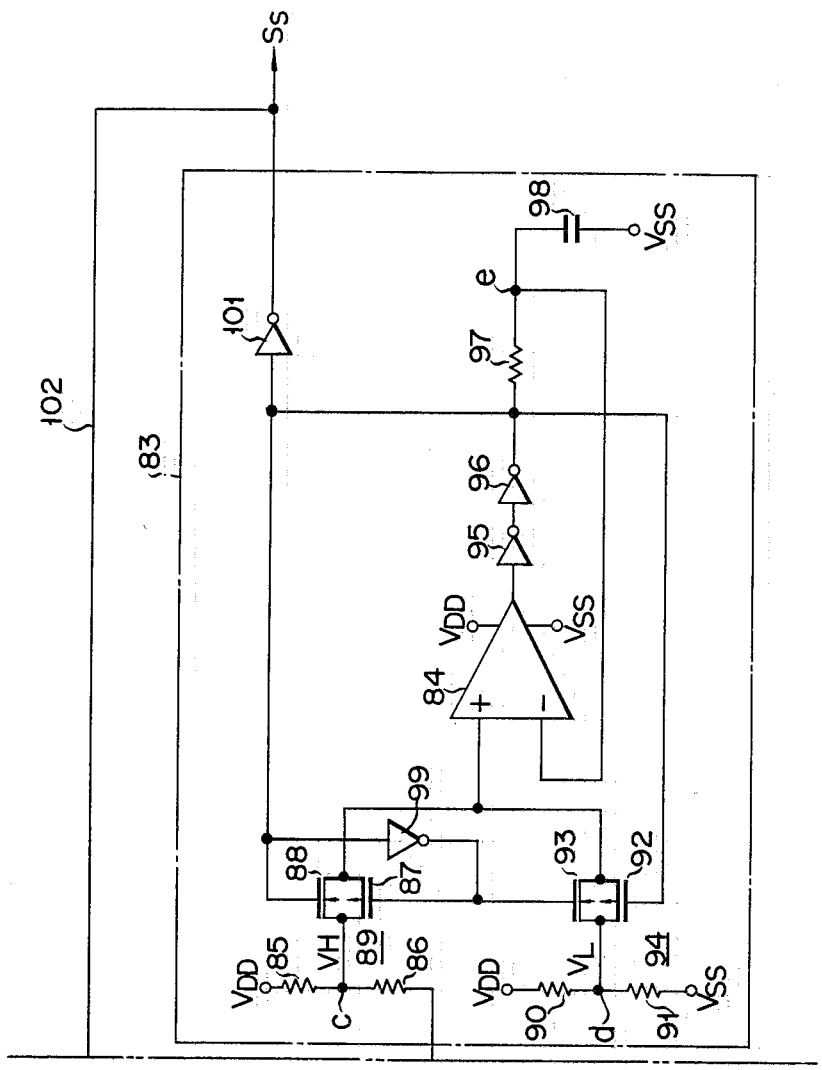

FIGS. 11A and 11B are circuit diagrams showing a construction of an embodiment of the oscillating circuit in FIG. 10. In the figures, the same numerals are used for the same parts in FIG. 2, thereby to omit the description thereof.

In the figure, the output of the integrator 30 is supplied through a voltage buffer circuit 80 to a Schmitt-type oscillator 83. The voltage buffer circuit 80 comprises a differential amplifier 81 with an inverted input terminal, non-inverted input terminal and output terminal. The inverted input terminal is connected to the output terminal. The inverted input terminal is supplied with the voltage $V_0$.

The Scmitt-type oscillator 83 is provided with a differential amplifier 84 with a non-inverted input terminal, inverted input terminal and output terminal. A higher level threshold voltage $V_H$ and lower-level threshold voltage $V_L$ are alternatively supplied to the non-inverted input terminal of the differential amplifier 84. The higher level threshold voltage $V_H$ is obtained at the serial connection c of the two resistors 85 and 86 serially connected at the point between the positive power supply voltage $V_{DD}$ and the output terminal of the voltage buffer circuit 80. The voltage $V_H$ is input to the non-inverted input terminal of the differential amplifier 84 through a CMOS switch 89 which comprises the P-channel MOSFET 87 and N-channel MOSFET 88. The lower level threshold voltage $V_L$ is obtained at the serial connection d of the resistors 90 and 91 serially connected between the point at which the positive power supply voltage $V_{DD}$ is applied and the point at which the negative power supply voltage $V_{SS}$ is applied. The voltage $V_L$ is input to the non-inverted input terminal of the differential amplifier 84 through a CMOS switch 94 which comprises the P channel MOSFET 92 and N channel MOSFET 93. Furthermore, DC voltage $V_{V1}$ is applied to the point a1 of the switched capacitor circuit 10, and variable DC voltage $V_{V2}$ is applied to the point a2 of the switched capacitor circuit 20.

Two inverters 95 and 96 are cascade-connected to the output terminal of the differential amplifier 84, and a resistor 97 and a capacitor 98 are serially connected between the output terminal of the inverter 96 in the lower stream and the point at which the voltage $V_{SS}$ is applied. The output signal of the inverter 96 is input in parallel to a gate of an N-channel MOSFET 88 which constitutes the CMOS switch 89 and a gate of a P-channel MOSFET 92 which constitutes the CMOS switch 94 as well as to two inverters 99 and 101.

The output signal of the inverter 99 is supplied in parallel to a gate of a P-channel MOSFET 87 which constitutes the CMOS switch 89 and a gate of an N-channel MOSFET 93 which constitutes the CMOS switch 94. Furthermore, a voltage at the point e where the resistor 97 and the capacitor 98 are serially connected is input to the inverted input terminal of the differential amplifier 84. The output signal of the inverter 101 is supplied to another circuit as the oscillating output signal $S_s$ and is fed back to the SC circuit 10 through a line 102.

In this embodiment, the three differential amplifiers 31, 81 and 84 operate at a voltage between the positive power supply voltage $V_{DD}$ and the negative power supply voltage whose absolute value is equal to $V_{DD}$. The voltage at the ground is set to 0 V which is intermediate between $V_{DD}$ and $V_{SS}$.

Now the operation of the Schmitt-type oscillating circuit 83 in the embodiment will first be described. Suppose that the resistance ratio of the resistors 85 and 86 and the threshold voltage $V_H$ obtained at the point c corresponding to the output voltage $V_0$ from the voltage buffer amplifier 80 are fixed, and that the voltage $V_H$ is higher than the threshold voltage $V_L$ obtained at the point d corresponding to the resistance ratio of the resistors 90 and 91. If the level of the output signal of the differential amplifer 84 is high ($V_{DD}$ level), the level of the output signal of the inverter 96 becomes high, so that the capacitor 98 discharges through the resistor 97 at the time constant $\tau$ corresponding to the resistor 97 and the capacitor 98. Thus, the voltage at the point e raises gradually. On the other hand, when the level of the output signal of the inverter 96 is high, the CMOS switch 89 turns on. Therefore, a high level threshold voltage $V_H$ is input to the non-inverted input terminal of the differential amplifier 84. The differential amlifier 84 compares the threshold voltage $V_H$ and the voltage at the point e. When the voltage at the point e reaches the threshold voltage $V_H$, the output signal of the differential amplifier 84 is inverted from a high level to a low level ($V_{SS}$ level). After the level inversion, the output signal of the inverter 96 is also inverted into two levels, and the capacitor 98 which has been charged now discharges with the time constant $\tau$ to the $V_{SS}$ level through the resistance 97. Therefore, the voltage at the point e then lowers gradually. On the other hand, when the output signal of the inverter 96 is at a low level, the CMOS switch 94 turns on and the lower level threshold voltage $V_L$ is input to the non-inverted input terminal of the differential amplifier 84 through the CMOS switch 94. Thus, the differential amplifier 84 compares the threshold value $V_L$ with the voltage at the point e. As a result, the lowering voltage at the point e reaches the threshold value $V_L$, and the output signal of the differential amplifier 84 is again inverted to a high level. As described above, the differential amplifier 84 alternatively compares the voltage at the point e with the threshold voltage $V_H$ and the threshold voltage $V_L$. Therefore, the output signal of the inverter 96 becomes an oscillating signal in which a high level and a low level are repeated alternatively. Futhermore, the output signal $S_s$ of the inverter 101 is also the oscillating signal as it is the inverted signal through the inverter 96. The frequency $f_s$ of the oscillating signal $S_s$ of the Schmitt-type oscillator 83 is constant when the threshold voltages $V_H$ and $V_L$ are constant. The value $f_s$ corresponds to the Schmitt width ($|V_H|+|V_L|$) determined by the threshold voltages $V_H$ and $V_L$, and the time constsnt $\tau$ is determined by the resistor 97 and the capacitor 98.

Figure 12:
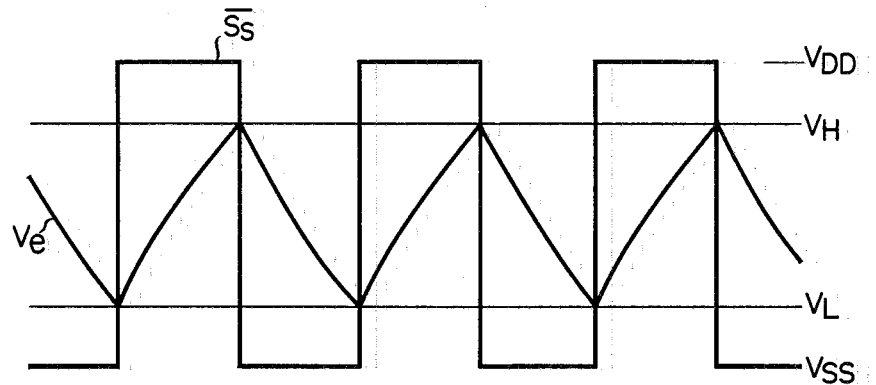
FIG. 12 is a waveform explaining an operation of the Schmitt trigger shown in FIGS. 11A and 11B.

FIG. 12 is a waveform showing the relation of the voltage Ve at the point e and the output voltage $\overline{S_s}$ of the inverter 96.

On the other hand, the equivalent resistance $R_1$ of the SC circuit 10, to which the oscillating signal $S_s$ from the Schmitt-type oscillating circuit 83 is input, is given by the equation (1) when the value of the capacitor 11 is $C_1$, as shown in FIG. 2.

Similarly, the equivalent resistance $R_2$ of the SC circuit 20, to which the signal $S_c$ is input, is given by the equation (2) when the value of the capacitor 21 is $C_2$.

As the positive voltage from the DC power supply $V_1$ or variable DC power supply $V_2$ is supplied to one terminal of the SC circuits 10 and 20, that is, the other terminal of the switch 13 in the SC circuit 10 and the other terminal of the switch 22 in the SC circuit 20, direct current flows in the SC circuits 10 and 20, respectively. On the other hand, as the SC circuit 10 has a negative equivalent resistance $R_1$, the direction of the current $I_1$ flowing in the SC circuit 10 is to the left (negative direction) in FIGS. 11A and 11B. And as other SC circuit 20 has a positive equivalent resistance $R_2$, the direction of the current $I_2$ flowing in the SC circuit 20 is to the right (positive direction) in FIGS. 11A and 11B. In other words, the directions of $I_1$ and $I_2$ are opposite to each other. The composite current of $I_1$ and $I_2$ is supplied to the integrator 30. When the composite current is negative, that is, the current $I_1$ is greater than the current $I_2$, the output voltage $V_0$ of the integrator 30 rises gradually to the positive power supply voltage $V_{DD}$.

On the contrary, when the composite current of $I_1$ and $I_2$ is positive, that is, the current $I_2$ is greater than the current $I_1$, the output voltage $V_0$ of the integrator 30 lowers gradually toward the negative power supply voltage. When the output currents $I_1$ and $I_2$ of the SC circuits 10 and 20 are balanced and their composite current becomes 0 during rising and lowering of the output voltage $V_0$ of the integrator 30, the change of the output voltage $V_0$ is ceased and can never be changed thereafter.

Supposed that the value of the DC power supply $V_1$ and the value of the variable DC power supply $V_2$ are equally set, and the values $C_1$ and $C_2$ of the capacitors 11 and 12 in the SC circuits 10 and 20 are equally set. Then, in the SC circuits 10 and 20 the composite current of $I_1$ and $I_2$ becomes 0, and the output voltage $V_0$ of the integrator 30 is fixed to some value when the coincidence between the frequecies $f_s$ and $f_c$ of the signals $S_s$ and $S_c$ is achieved. When value $V_0$ is fixed, the higher threshold voltage $V_H$ formed in the Schmitt-type oscillator 83 is fixed, thereby fixing the Schmitt width ($|V_H|+|V_L|$) and frequency $f_s$ of the oscillating signal $S_s$.

Now suppose the frequency $f_s$ lowers from the balance between the two frequencies $f_s$ and $f_c$. When the frequency $f_s$ lowers, the equivalent resistance $R_1$ of the SC circuit 10 given by the equation (1) becomes greater than before, and thus the absolute value of the current $I_1$ becomes smaller. The composite current of $I_1$ and $I_2$ becomes positive, and the output voltage $V_0$ of the integrator 30 lowers toward $V_{ss}$. Then, the voltage $V_H$ obtained at the point c in the Schmitt-type oscillator lowers. Therefore, the Schmitt width ($|V_H|+|V_L|$) is narrower, thereby raising the frequency $f_s$ of the oscillating signal $S_s$ in the Schmitt-type oscillating circuit 83. When frequency $f_s$ rises, the equivalent resistance $R_1$ of the SC circuit 10 becomes smaller and the absolute value of current $I_1$ gradually becomes greater. As a result, the composite current of $I_1$ and $I_2$ decreases and becomes 0 when the frequency $f_s$ coinciding with the frequency $f_c$ lowers, and the output voltage $V_0$ of the integrator 30 rises toward $V_{DD}$ until $f_s$ equals $f_c$. When the output voltage $V_0$ returns to its original value, the rise of the voltage is ceased, and the rise of frequency $f_s$ is also ceased when the frequency $f_s$ of the oscillating signal $S_s$ coincides with the frequency $f_c$.

Now suppose the frequency $f_s$ rises under the condition that the frequency $f_s$ coincides with the frequency $f_c$. When the frequency $f_s$ rises, the equivalent resistance $R_1$ of the SC circuit 10 given by the equation (1) becomes lower, and the absolute value of the current $I_1$ becomes greater. The composite current of $I_1$ becomes greater. The composite current of $I_1$ and $I_2$ becomes negative, and the output voltage $V_0$ of the integrator 30 rises toward $V_{DD}$. When the voltage $V_0$ rises, the higher threshold voltage $V_H$ becomes higher than before, and the Schmitt width ($|V_H|+|V_L|$) becomes wider than before. Therefore, the frequency $f_s$ of the oscillating output signal $S_s$ in the Schmitt-type oscillating circuit 83 lowers. When the frequency $f_s$ lowers, the equivalent resistance $R_1$ of the SC circuit 10 becomes greater, and the absolute value of the current $I_1$ gradually becomes smaller.

The composite value of the current $I_1$ and $I_2$ increases toward 0 from negative and becomes 0 when $f_s$ coincides with $f_c$. Thus, when the frequency rises, the output voltage $V_0$ of the integrator 30 lowers toward $V_{ss}$ until $f_s$ coincides with $f_c$. When the output voltage $V_0$ becomes its original value, the lowering of the voltage ceases. And lowering of the frequency $f_s$ is also ceased when the frequency $f_s$ of the oscillating output signal $S_s$ coincides with $f_c$.

In other words, in this embodiment, the frequency $f_s$ of the oscillating output signal $S_s$ is controlled so as to coincide with the frequency $f_c$ of the signal $S_c$.

Now the setting of the variable DC power supply V2 will be explained. When the voltage V2 is set higher than V1, the output current I2 of the SC circuit 20 becomes greater than before since the equivalent resistance R2 of the SC circuit 20 is constant. In order to balance the currents I1 and I2 and to make the composite current 0, the absolute value of the output current I1 of the SC circuit 10 must be greater than before.

When the current I2 becomes greater, the output voltage V0 of the integrator 30 lowers toward $V_{ss}$, and thereafter, the frequency $f_s$ of the oscillating output signal of the Schmitt-type oscillator 83 rises. The rise in the frequency $f_s$ continues until the absolute value of the output current I1 of the SC circuit 10 coincides with the absolute value of the current I2. When the voltage V2 is set higher than the voltage V1, the frequency $f_s$ of the oscillating output signal $S_s$ is controlled to be constant at a point higher than the frequency $f_c$.

When the voltage V2 is set lower than the voltage V1, the output current I2 of the SC circuit 20 becomes smaller than before. In order to balance the currents I1 and I2 and to make the composite current 0, the absolute value of the output current I1 of the SC circuit 10 must be smaller than before.

When the current I2 becomes smaller, the output voltage V0 of the integrator 30 rises toward $V_{DD}$ and, therefore the frequency $f_s$ of the oscillating output signals $S_s$ lowers. The lowering of the frequency $f_s$ continues until the absolute value of output current I1 of the $S_c$ circuit 10 coincides with the absolute value of I2. In other words, when V2 is set lower than V1, the frequency $f_s$ of the oscillating output signal $S_s$ is controlled to be lower than $f_c$.

In this embodiment, the condition where the oscillating frequency $f_s$ becomes stabilized is when the composite current of I1 and I2 of the SC circuits 10 and 20 becomes 0. Thus, the stabilizing condition is give by:

$$I_1 + I_2 = 0 \qquad (7)$$

By substituting the relation of R1 and R2 given in the equations (1) and (2) for the equation (7), the following equation is obtained:

$$-C_1 f_s V_1 + C_2 f_c V_2 = 0 \qquad (8)$$

From the equation (8), the following equation is obtained:

$$f_s = \frac{C_2}{C_1} \cdot \frac{V_2}{V_1} \cdot f_c \qquad (9)$$

As it is assumed that $C_1 = C_2$, $f_s$ equals $f_c$ times $V_2/V_1$. Therefore, the signal $S_s$ having the frequency $f_s$ equal an arbitrary multiple of the frequency $f_c$.

Figure 13:
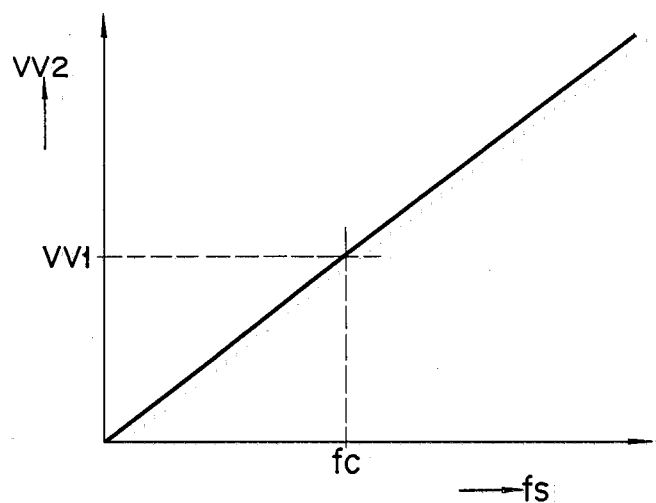
FIG. 13 is a characteristic of an oscillating circuit shown in FIGS. 11A and 11B.

FIG. 13 shows a characteristic of the above embodiment when $C_1 = C_2$. In the figure, the frequency $f_s$ of the oscillating signal $S_s$ is measured on the abscissa and the value of the variable power supply V2 is measured on the ordinate. As is shown, $f_s$ is related to V2 linearly.

The equivalent resistances R1 and R2 in the SC circuits 10 and 20 are determined only by the frequencies $f_s$ and $f_c$ if $C_1 = C_2$, as shown in the equations (1) and (2). Since the values C1 and C2 of the capacitors 11 and 21 can be set with relatively higher accuracy than the resistances, the frequencies $f_s$ and $f_c$ can be converted into resistances R1 and R2 with high accuracy. The difference between the resistances R1 and R2 is converted into current and then converted into voltage. The oscillating frequency $f_s$ of the Schmitt-type oscillator 83 can be adjusted corresponding to the above voltage. Thus, the frequency $f_s$ can be stably adjusted with high accuracy.

In the above embodiment, the adjustment of the oscillating frequency $f_s$ is performed by varying the value of the variable DC power supply V2. That is, as is apparent from the equation (8), the values C1 and C2 of the capacitors 11 and 21 in the SC circuits 10 and 20 are changed, and a multiple frequency corresponding to the ratio of C1 and C2 is produced. For example, by setting the C1 and C2 as $n \cdot C_1 = C_2$, the frequency $f_s$ can be adjusted to be a frequency n times as much as the frequency $f_c$. Furthermore, the n must not be an integer but may be a real number including a decimal. This applies to when the adjustment of the frequency $f_s$ is performed by changing the variable DC power supply V2. Furthermore, V1 may be a variable power supply instead of V2.

FIG. 14 is a block diagram showing another embodiment of the present invention. In the embodiment, a frequency divider 110 is added to the embodiment of FIGS. 11A and 11B. The frequency divider 110 divides the oscillating output signal $S_s$ of the Schmitt-type oscillator 83 into 1/n. The SC circuit 10 is controlled by the 1/n divided signal $S'_s$ instead of the oscillating signal $S_s$.

According to the above construction, the frequency $f_s$ of the oscillating output signal $S_s$ is controlled to be constant at a frequency n times as much as the frequency $f_s$ in the embodiment of FIGS. 11A and 11B.

FIG. 15 is a circuit diagram showing an example of the frequency divider 110 in FIG. 14 in detail. The frequency divider 110 in this embodiment frequency divides the oscillating output signal by ⅛. The divider 110 is a known circuit and comprises three D-type flip-flops 111 through 113. Each data input terminal D of the flip-flops 111 through 113 is connected to the respective first output terminal $\overline{Q}$, and each second output terminal Q in the previous stage is connected to each clock input terminal cp in the next stage. The oscillating output signal $S_s$ from the Schmitt-type oscillator 83 is supplied to the clock input terminal of the flip-flop 111 in the first stage and, the ⅛ frequency-divided signal $S'_s$ is output from the second output terminal of the flip-flop 113 in the final stage. The division ratio can be modified by adjusting the number of flip-flops.

Figure 16:
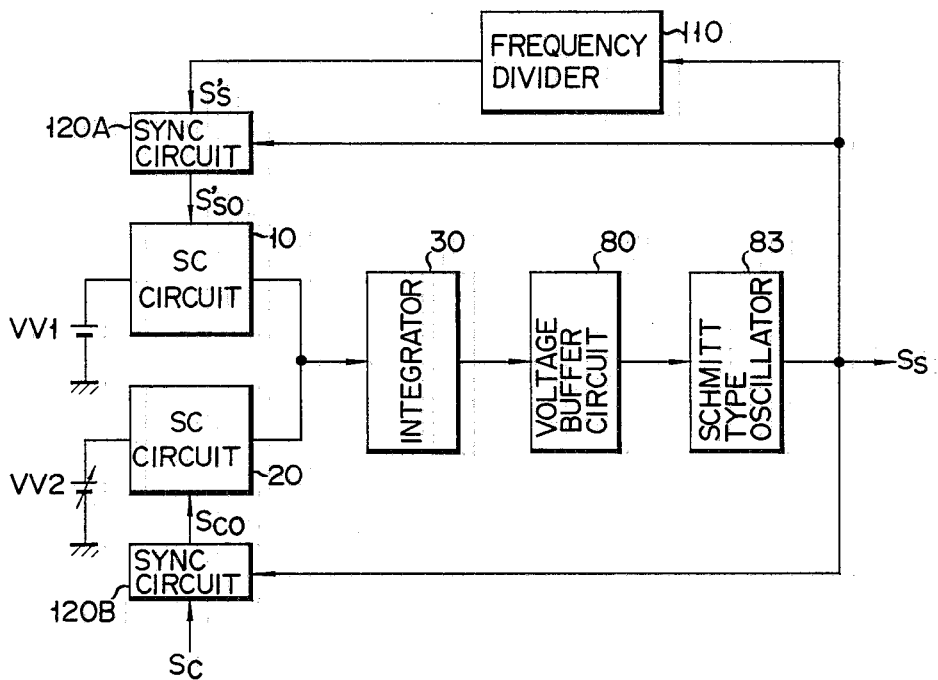
FIG. 16 is a block diagram showing another embodiment of the oscillator of the invention.

FIG. 16 is a block diagram showing another embodiment of the present invention. This embodiment further comprises the frequency divider 110 in FIG. 14 and two synchronizing circuits 120A and 120B. The frequency divider 110 is constructed the same as that in FIG. 15 and frequency divides the oscillating signal $S_s$ by ⅛ to produce the signal $S'_s$. The synchronizing circuit 120A synchronizes the ⅛ frequency-divided signal $S'_s$ with the signal $S_s$, which is not frequency divided. The SC circuit 10 is controlled by the output signal $S'_{so}$ of the synchronizing circuit 120A. The synchronizing circuit 120B synchronizes the reference signal $S_c$ with the oscillating signal $S_s$ of the Schmitt-type oscillator 83. The SC circuit 20 is controlled by the output signal $S_{co}$ of the synchronizing circuit 120B.

Figure 17:
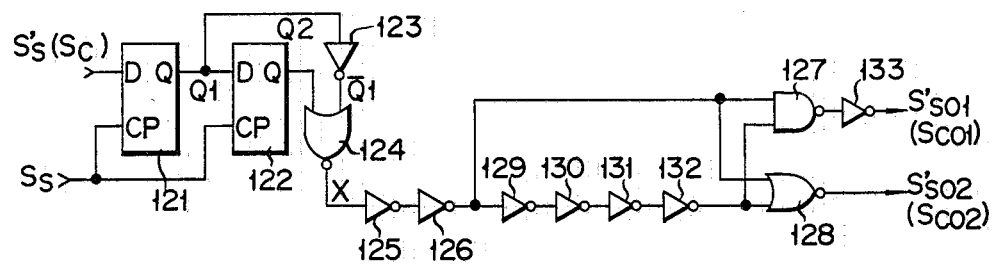
FIG. 17 is a detailed circuit diagram of an embodiment of a synchronizing circuit shown in FIG. 16.

FIG. 17 shows the synchronizing circuits 120A and 120B in FIG. 16 in detail. The synchronizing circuits 120A and 120B are the same in construction but different in their input signals. The oscillating signal $S_s$ from the Schmitt-type oscillator 83 is supplied to the clock input terminals (cp) of the synchronized D-type flip-flops 121 and 122. The frequency-divided signal $S'_s$ from the frequency divider 110 is supplied to the data input terminal D of the synchronizing circuit 120A, and the signal $S_c$ is supplied to the input terminal D of the synchronizing circuit 120B. The signal $\overline{Q_1}$ of the output terminal Q of the one flip-flop 121 is supplied to the data input terminal of the other flip-flop 122 and to the inverter 123. The output signal $Q_1$ of the inverter 123 is supplied in parallel together with the signal $Q_2$ from the other flip-flop 122 to a NOR gate 124. The output signal X of the NOR gate 124 is supplied to a NAND gate 127 and a NOR gate 128 through two cascade-connected inverters 125 and 126. The output signal of the inverter 126 is supplied to the NAND gate 127 and NOR gate 128 through four cascade-connected inverters 129 through 132. Furthermore, the output signal of the NAND gate 127 is supplied to the inverter 133. The output signal of the inverter 133 is supplied to the SC circuit 10 as the signal to control the switches 13 and 14 in the SC circuit 10 when the signal to be supplied to the flip-flop 121 is $S'_s$, and is supplied to the SC circuit 20 as the signal to control the switches 23 and 25 in the $S_c$ circuit 20 when the signal to be supplied to the flip-flop 121 is $S_c$. The output signal of the NOR gate 128 is supplied to the SC circuit 10 as the signal to control the switches 12 and 15 in the SC circuit 10 when the signal to be supplied to the flip-flop 121 is $S'_s$ and is supplied to the SC circuit as the signal to control the switches 22 and 24 in the SC circuit 20 when the signal $S_c$ to be supplied to the flip-flop 121 is $S_c$.

The synchronizing circuits 120A and 120B as shown in FIG. 17 operate as follows. Suppose that the signal $S'_s$ has the phase distortion as shown in FIG. 18B against the oscillating output signal $S_s$ (FIG. 18A) from the Schmitt-type oscillator 83. The flip-flops 121 and 122 set the levels of the output signals $Q_1$ and $Q_2$ in FIGS. 18C and 18D to those of the input signals in synchronism with the leading edge of the clock input signal, that is, the signal $S_s$, and holds the previous output level at the trailing edge of the signal Sc. Therefore, the output signals $Q_1$ and $Q_2$ vary as shown in FIGS. 18C and 18D. Thus, the pulse signal is obtained as the output signal X (FIG. 18F) of the NOR gate 124, which is synchronized with the signal $S_s$ and is at a high level during one period of the signal $S_s$. Using the delayed time obtained by the inverters 129 through 132. The circuit which comprises the inverters 129 through 132 to which the signal X is supplied (the inverter 133, NAND gate 127 and NOR gate 128) forms from the signal X a pair of signals $S'_{so1}$ and $S'_{so2}$, as shown in FIGS. 18G and 18H, corresponding to the two phase signals $S_{s1}$ and $S_{s2}$, as shown in FIGS. 6A and 6B, with high level durations which do not overlay each other. The switches 12 and 15 in the $S_c$ circuit 10 controlled by the signal $S'_{so1}$ turn on for nearly one cycle of the signal $S_s$. In other words, the duration the positive charge flows into the SC circuit 10 is set to the duration corresponding to nearly one cycle of the signal $S_s$. Also in the synchronizing circuit 120B to which the signal $S_c$ is supplied as the input signal, a pulse signal is obtained which is in synchronism with the signal $S_s$ and is at a high level during one cycle of the signal $S_s$ as the output signal X of the NOR gate 124. Furthermore, a pair of signals $S_{co1}$ and $S_{co2}$ are formed corresponding to the two-phase signals $S_{c1}$ and $S_{c2}$ as shown in FIGS. 6A and 6B.

The switches 22 and 24 in the SC circuit 20 controlled by the signal corresponding to the signal $S'_{so1}$ in FIG. 18G turn on for nearly one cycle of the signal $S_s$. That is, the duration for the positive charge flowing out from the SC circuit 20 is set to nearly one cycle of the signal $S_s$ as in the case of the SC circuit 10. Therefore, the embodiment of FIG. 16 satisfies the equation (8), thereby preventing the generation of the error when the oscillating frequency is relatively large. As shown in FIGS. 18G and 18H, the high level durations of the signal $S'_{so1}$ and $S'_{so2}$ (or $S'_{co1}$ and $S'_{co2}$) are not overlayed. Therefore, the switches 12 and 15 and the switches 13 and 14 are not simultaneously turned on, and the error for the current $I_1$ is not generated. This applys also to the SC circuit 20.

The present invention is not limited to the above embodiments but various modifications can be performed. For example, in the embodiments of FIGS. 11A, 11B, 14 and 16, the oscillating circuit in which the oscillating frequency is controlled by the composite current of the output currents of the SC circuits 10 and 20 is a Schmitt-type oscillating circuit 83. However, any type of oscillating circuits having the same function may be used. Further in the above embodiment, the SC circuit 10 having negative equivalent resistance is controlled by the signal $S_s$, and the $S_c$ circuit 20 having positive equivalent resistance is controlled by the signal $S_c$. However, these signals are interchangeable.

What is claimed is:

1. A frequency comparing circuit, comprising:
    first means having negative equivalent resistance, the value of which being determined according to the frequency of a first signal;
    second means having positive equivalent resistance, the value of which being determined according to the frequency of a second signal;
    third means for supplying DC bias to said first and second means; and
    fourth means for integrating composite value of output currents of said first and second means.

2. A frequency comparing circuit according to claim 1, wherein each of said first and second means comprises a switched-capacitor circuit including a capacitor and a plurality of switches.

3. A frequency comparing circuit according to claim 1, wherein said third means comprises a DC power supply which supplies a constant DC voltage to said first and second means.

4. A frequency comparing circuit according to claim 1, wherein said fourth means comprises a differential amplifier and a capacitor for integration connected between input and output terminals of said amplifier.

5. A frequency comparing circuit according to claim 4, further comprising a resistor connected to said capacitor in parallel.

6. A frequency comparing circuit, comprising:
    first means having negative equivalent resistance, the value of which is determined according to the frequency of a first signal;
    second means having positive equivalent resistance, the value of which is determined according to the frequency of a second signal;
    D.C. bias voltage means, third means for integrating a composite value of output currents of said first and second means to produce an output voltage when said D.C. bias voltage is supplied to said first and second means;

fourth means for supplying said D.C. bias to one of said first and second means; and fifth means for supplying said D.C. bias corresponding to the output voltage of said third means to the other of said first and second means.

7. A frequency comparing circuit according to claim 6, wherein each of said first and second means comprises a switched capacitor circuit including a capacitor and a plurality of switches.

8. A frequency comparing circuit according to claim 6, wherein said third means comprises a differential amplifier, and a capacitor for integration connected between input and output terminals of said amplifier.

9. An oscillating circuit, comprising:

first means having negative equivalent resistance, the value of which being determined according to the frequency of a first signal;

second means having positive equivalent resistance, the value of which being determined according to the frequency of a second signal;

third means for supplying a direct current to said first and second means;

fourth means for producing an oscillating signal whose frequency is adjusted according to the composite current value of output currents of said first and second means; and fifth means for feeding back the oscillating signal to said first means as the first signal.

10. An oscillating circuit according to claim 9, wherein each of said first and second means comprises a switched capacitor circuit including a capacitor and a plurality of switches.

11. An oscillating circuit according to claim 9, wherein said third means comprises:

a DC power supply for supplying a constant DC voltage to one of said first and second means; and a variable DC power supply for supplying a DC voltage for adjusting the frequency of an oscillating signal output from said fourth means to the other of said first and second means.

12. An oscillating circuit according to claim 9, wherein said fourth means comprises a Schmitt-type oscillating circuit having first and second threshold voltages, either one of the first and second threshold voltages being adjusted according to the composite values of the output currents of said first and second means.

13. An oscillating circuit, comprising:

first means having negative or positive equivalent resistance, the value of which is set according to the frequency of a first signal;

second means having positive or negative equivalent resistance the value of which is set according to the frequency of a second signal;

third means for supplying DC bias to said first and second means to flow a direct current therein;

fourth means for producing an oscillating signal whose frequency is adjusted according to a composite current value of output currents of said first and second means; and fifth means for frequency-dividing the oscillating signal and for feeding the frequency-divided signal back to said first means as the first signal.

14. An oscillating circuit according to claim 13, wherein each of said first and second means comprises a switched capacitor circuit having a capacitor and a plurality of switches.

15. An oscillating circuit according to claim 13, wherein said third means comprises:

a DC power supply for supplying a constant DC voltage to one of said first and second means; and a variable DC power supply for supplying a DC voltage for adjusting the frequency of the oscillating signal output from said fourth means to the other of said first and second means.

16. An oscillating circuit according to claim 13, wherein said fourth means comprises a Schmitt-type oscillating circuit having first and second threshold voltages, either one of the first and second threshold voltages being adjusted according to the composite values of the output currents of said first means and second means.

17. An oscillating circuit, comprising:

first means having negative or positive equivalent resistance, the value of which is set according to the frequency of a first signal;

second means having positive or negative equivalent resistance, the value of which is set according to the frequency of a second signal;

third means for supplying DC bias to said first and second means to flow direct current therein;

fourth means for producing an oscillating signal whose oscillating frequency is adjusted according to the composite values of the output currents of said first and second means;

fifth means for frequency-dividing the oscillating signal;

sixth means for synchronizing the frequency output signal from said fifth means with the oscillating signal and for supplying the synchronized signal to said first means as the first signal; and seventh means for synchronizing the second signal with the oscillating signal and for supplying the synchronized signal to said second means.

18. An oscillating circuit according to claim 17, wherein each of said first and second means comprises a switched capacitor circuit having a capacitor and a plurality of switches.

19. An oscillating circuit according to claim 17, wherein said third means comprises:

a DC power supply for supplying a constant DC voltage to one of said first and second means; and a variable DC power supply for supplying a DC voltage for adjusting the frequency of the oscillating signal output from said fourth means to the other of said first and second means.

20. An oscillating circuit according to claim 17, wherein said fourth means comprises a Schmitt-type oscillating circuit having first and second threshold voltages, either one of the first and second threshold voltages being adjusted according to the composite values of the output currents of said first and second means.

21. A circuit for determining if the frequency of a subject signal is between a high frequency reference signal and a low frequency reference signal, comprising:

first means having negative equivalent resistance, the value of which is determined according to the frequency of said high frequency reference signal;

second means having positive equivalent resistance, the value of which is determined according to the frequency of said subject signal;
third means having negative equivalent resistance, the value of which is determined according to the frequency of said low frequency reference signal;
fourth means having positive equivalent resistance, the value of which is determined according to the frequency of said subject signal;
means for supplying a D.C. bias voltage to said first, second, third and fourth means;

first integrating means for integrating the composite value of the output currents of said first and second means and generating an output signal;
second integrating means for integrating the composite value of the output currents of said third and fourth means and generating an output signal;
gate means for receiving the respective outputs of said first integrating means and said second integrating means and for detecting whether the frequency of said subject signal is between said high frequency reference signal and said low frequency reference signal.

* * * * *